United States Patent
Okada

(10) Patent No.: US 6,821,882 B2
(45) Date of Patent: Nov. 23, 2004

(54) SEMICONDUCTOR DEVICE MANUFACTURING METHOD FOR IMPROVING ADHESIVITY OF COPPER METAL LAYER TO BARRIER LAYER

(75) Inventor: Norio Okada, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/758,392

(22) Filed: Jan. 16, 2004

(65) Prior Publication Data

US 2004/0152306 A1 Aug. 5, 2004

(30) Foreign Application Priority Data

Jan. 30, 2003 (JP) ........................................ 2003-021956

(51) Int. Cl.⁷ .......................................... H01L 21/4763
(52) U.S. Cl. ...................... 438/627; 438/635; 438/637; 438/643; 438/648; 438/653; 438/656; 438/660; 438/685; 438/687
(58) Field of Search ................................ 438/627, 635, 438/637, 643, 648, 653, 656, 660, 685, 687

(56) References Cited

U.S. PATENT DOCUMENTS

| 6,730,594 B2 | * | 5/2004 | Noguchi et al. ............. 438/653 |
| 2003/0047539 A1 | * | 3/2003 | Ma et al. ..................... 438/692 |
| 2003/0079416 A1 | * | 5/2003 | Ma et al. ..................... 438/692 |

FOREIGN PATENT DOCUMENTS

| JP | 11-269693 | 10/1999 |
| JP | 2001-156168 | 6/2001 |
| JP | 2001-298028 | 10/2001 |

OTHER PUBLICATIONS

Kai–Min Yin et al., "Oxidation of TA Diffusion Barrier Layer for CU Metallization in Thermal Annealing", 741–20005,, Thin Solid Films 388 (2001)27–33.

* cited by examiner

*Primary Examiner*—Lynne A. Gurley
(74) *Attorney, Agent, or Firm*—Young & Thompson

(57) ABSTRACT

A method of manufacturing a semiconductor device according to the present invention forms a laminate metal film having a copper metal layer and a barrier metal, and once immerses the laminate metal film in a solution including organic acid having at least one carboxyl group before a heat treatment, thereby removing from the laminate metal film an oxide which is the source of oxygen that diffuses during the heat treatment.

12 Claims, 3 Drawing Sheets

SEMICONDUCTOR DEVICE MANUFACTURING METHOD FOR IMPROVING ADHESIVITY OF COPPER METAL LAYER TO BARRIER LAYER

BACKGROUND OF THE INVENTION

1. Field of the Invention

The present invention relates to a method of manufacturing a semiconductor device which has a copper metal layer that is a metal layer mainly containing copper.

2. Description of the Related Art

Conventionally, it is difficult to etch a copper metal. This imposes the use of a damascene-based wire forming technique for copper metal layers, unlike the formation of wires by etching aluminum. The damascene method is disclosed, for example, in JP-2001-156168-A in the following manner. After grooves are formed in an insulating film for wiring, a barrier metal, later serving as a barrier layer for preventing copper from diffusing, a seed layer, and a copper metal layer are formed in order. Subsequently, a copper grain growth annealing is performed for growing grains of copper, followed by CMP (Chemical and Mechanical Polishing) processing to polish the copper metal layer until the insulating film is exposed, and copper wires are formed in the grooves.

Next, description will be made on the grain growth process in the copper metal layer in the prior art technique mentioned above.

FIGS. 1A to 1C are cross-sectional views of a structure for showing a grain growth process in a copper metal layer, and an oxidation process in a barrier metal.

As illustrated in FIG. 1A, a barrier metal composed of tantalum nitride (TaN) film 112 and tantalum (Ta) film 114 is formed on interlayer insulating film 110 deposited on a semiconductor substrate, not shown. Subsequently, a seed layer and copper metal layer 116 are formed on the barrier metal. As copper metal layer 116 is exposed to the atmosphere after the formation, the surface of copper metal layer 116 is oxidized to form copper oxide 118 on the surface of copper metal layer 116, as illustrated in FIG. 1A.

Subsequently, as copper grain growth annealing is started for growing grains of copper, grain interfaces 120 occur as more grains of copper grow, as illustrated in FIG. 1B. Afterwards, as the growth of copper grains approaches the end, oxygen contained in copper oxide 118 diffuses toward the barrier metal along grain interfaces 120, as illustrated in FIG. 1C. As the oxygen reaches the barrier metal, a tantalum oxide compound is produced on the bottom of copper metal layer 116 because tantalum is more susceptible to oxidization than copper. The principles of producing a tantalum oxide compound are shown in literature of K.Yin et al., "Oxidization of Ta diffusion barrier layer for Cu metallization in thermal annealing/Thin Solid Films," 388 (2001), pp. 27–33.

The tantalum oxide compound may give rise to the following problems.

Copper oxide 118 remaining on copper metal layer 116 is removed in the subsequent CMP processing. On the other hand, the tantalum oxide compound formed on the interface between the barrier metal and copper metal layer 116 still remains within the subsequently formed wires. The residual tantalum oxide compound degrades the adhesivity of copper metal layer 116 to the barrier metal, resulting in a lower reliability of wires, particularly, deteriorated stress-migration and electro-migration. The residual tantalum oxide compound can also cause a stress-induced-voiding in which stresses produce voids in the wires.

Further, an extremely degraded adhesivity of copper metal layer 116 to the barrier metal would cause copper metal layer 116 to peel, resulting in defective wires and hence broken wires.

SUMMARY OF THE INVENTION

It is an object of the present invention to provide a method of manufacturing a semiconductor device which prevents a degradation in adhesivity of a copper metal layer to a barrier metal.

In the present invention, after forming a laminate metal film having a copper metal layer and a barrier metal, the laminate metal film is once immersed in a solution including an organic acid having at least one carboxyl group before a heat treatment, thereby removing from the laminate metal film an oxide which is the source of oxygen that diffuses during the heat treatment. It is therefore possible to prevent the barrier metal from reacting with oxygen and therefore suppress the generation of an oxide on the interface between the barrier metal and copper metal layer. Consequently, the method of the present invention can prevent degraded adhesivity of the copper metal layer to the barrier metal, and prevent deteriorated stress-migration and electro-migration for a wire using the laminate metal film. The method of the present invention can further prevent a stress-induced-voiding in the wire using the laminate metal film.

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 1A:
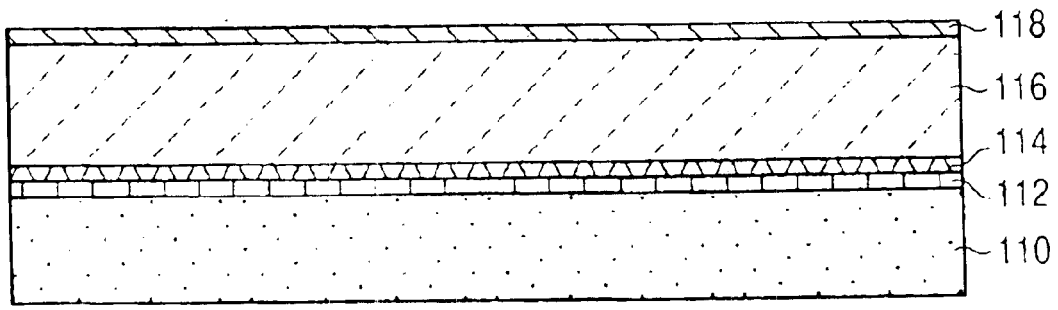
FIGS. 1A to 1C are cross-sectional views of a structure showing a grain growth process in a copper metal layer and a process of oxidizing a barrier metal.
Figure 1B:
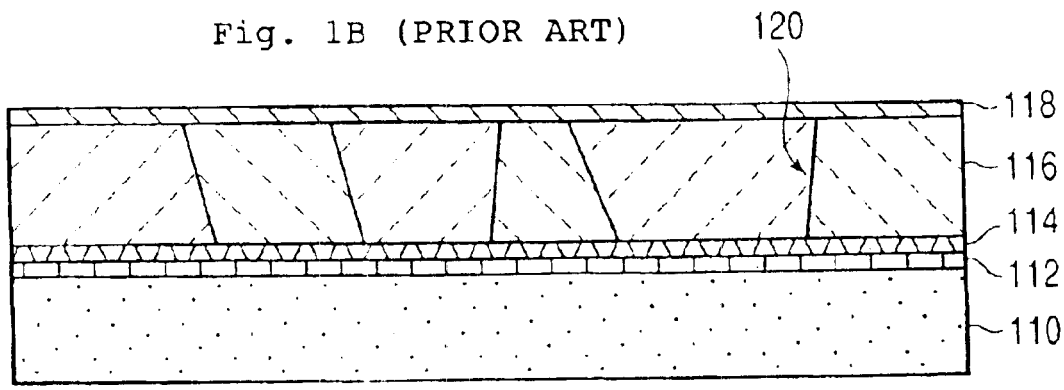
Figure 1C:
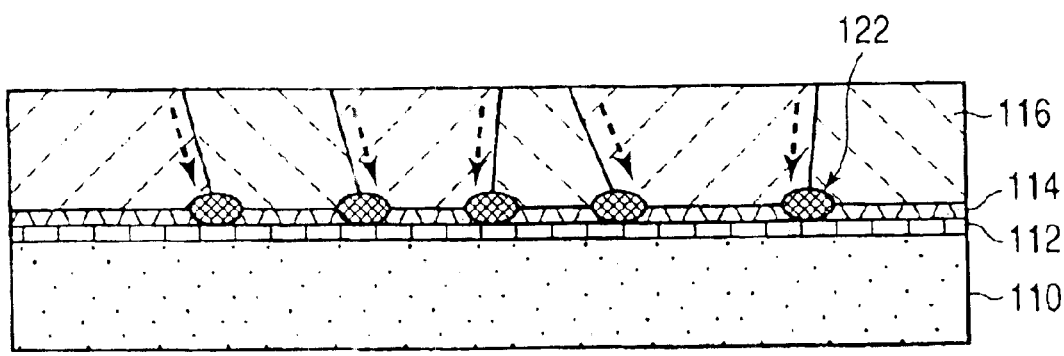
Figure 2A:
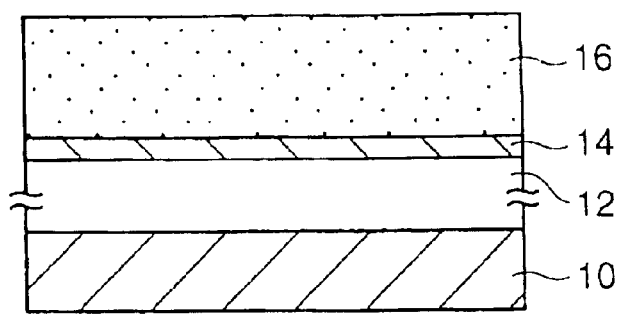
FIGS. 2A to 2D are cross-sectional views of a structure for explaining a method of manufacturing a semiconductor device according to the present invention.

After semiconductor elements, not shown, have been formed on semiconductor substrate 10 shown in FIG. 2A, oxide film ($SiO_2$ film) 12 is formed on the semiconductor elements in a thickness of 100–300 nm as an interlayer insulating film. SiCN film 14 is formed on $SiO_2$ film 12 in a thickness of 10–150 nm as an etching stopper film for improving wire workability. Further, $SiO_2$ film 16 is formed on SiCN film 14 in a thickness of 100–1800 nm as an insulating film for the formation of wires. In the following, the SiCN film which serves as an etching stopper film is called the "stopper SiCN film." Also, in a process of sequentially forming semiconductor elements such as transistors, resistors, capacitors, and the like as well as wires for connecting the semiconductor elements on the semiconductor substrate, the semiconductor substrate including such semiconductor elements formed thereon is collectively called the "wafer."

Figure 2B:
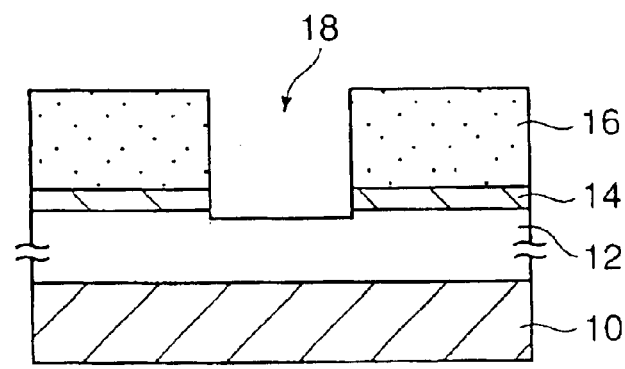

Subsequently, after a resist pattern has been formed on $SiO_2$ film 16 in a lithography process, $SiO_2$ film 16 is etched until stopper SiCN film 14 is exposed. After removing the resist pattern, Stopper SiCN film 14 is etched away using SiO$_2$ film 16 as a mask to form groove 18 for wiring (FIG. 2B).

Figure 2C:
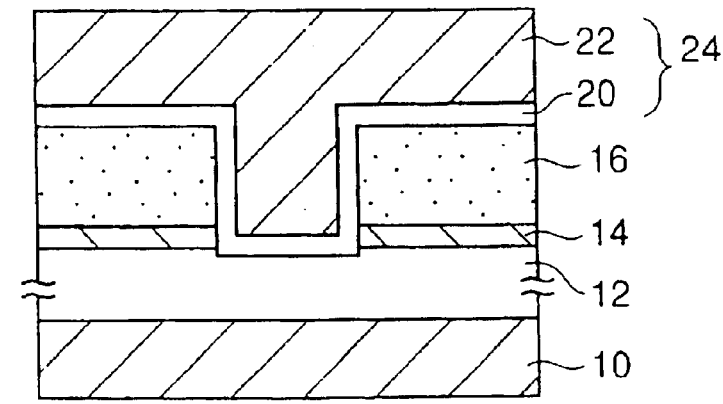

Subsequently, a TaN film 1–40 nm thick and Ta film 1–40 nm thick are deposited in order by sputtering to form barrier metal 20 composed of the TaN film and Ta film. A seed layer mainly containing copper is formed on barrier metal 20. Then, the wafer is immersed in an electrolyte plating solution containing copper sulfate (CuSO$_4$) to form copper metal layer 22 on the seed layer in a thickness of 40–3000 nm by an electrolyte plating method, thereby forming laminate metal film 24 composed of barrier metal 20 and copper metal layer 22 (FIG. 2C). After the formation of copper metal layer 22, as laminate metal film 24 is exposed to the atmosphere, copper oxide is formed on the surface of laminate metal film 24 by the action of oxygen in the air.

Subsequently, the wafer is immersed in a solution including an organic acid in an organic acid solution treatment for 5–100 sec before the wafer is annealed for growing copper grains. The organic acid solution used herein is an oxalic acid solution which includes oxalic acid ((COOH)$_2$) in volume concentration of 0.1–3% as an organic acid which includes at least one carboxyl group. This organic acid solution treatment removes the copper oxide. After the organic acid solution treatment, moisture is removed by a spin dry method to dry the wafer. Subsequently, in a batch furnace annealing apparatus which processes a plurality of wafers in a batch, the wafers are annealed for growing copper grains (copper grain growth annealing) at temperatures of 200–450° C., in an inert gas atmosphere mainly provided by an N$_2$ gas for a processing time of 10–200 minutes.

Figure 2D:
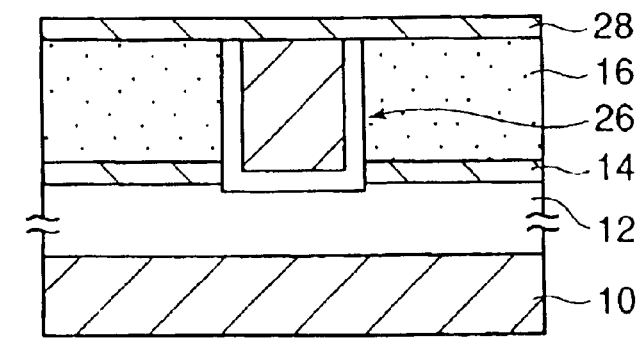

Subsequently, laminate metal film 24 is polished by CMP processing until the top surface of SiO$_2$ film 16 is exposed, followed by formation of copper wire 26 composed of barrier metal 20 and copper metal layer 22. After the CMP processing, as abrasive particles sticking on the top surface of the copper wire is washed away, water reacts with copper during the washing to form a copper oxide layer on the top surface of the copper wire. Next, the copper oxide layer is exposed to a 1% diluted solution of benzotriazole (BTA) to make BTA react with the copper oxide layer to form a BTA layer which serves as an oxidization preventing layer. After the BTA layer on the copper wire has been removed by thermal decomposition, cap SiCN film 28 is formed in a thickness of 10–150 nm as a copper diffusion preventing film by a CVD method (FIG. 2D).

Subsequently, pads for electrically connecting a circuit comprising semiconductor elements, copper wires, and the like to the outside, and a passivation film are formed.

Next, description will be made of an experiment method for evaluating the effect of the organic acid solution treatment before the copper grain growth annealing.

Two sample wafers used in the evaluation were fabricated in the following manner. Two wafers, which have been processed up to the step illustrated in FIG. 2C, were prepared. Before the copper grain growth annealing, one of the two wafers underwent the organic acid solution treatment, whereas the other wafer did not undergo the organic acid solution treatment. Then, the two wafers underwent the copper grain growth annealing, CMP processing, and washing.

For the wafer which had been treated with an organic acid solution and the wafer which had not been so treated, locations of wire defects were counted on each of the wafers for comparison. The wire defect location was identified by comparing a wiring pattern formed on each of the wafers with a wiring pattern of a reference exposure mask to find a location on the wafer under evaluation at which the pattern was different from that at a corresponding location on the reference exposure mask, determining that the pattern was missing at this location, and regarding this location as the location of a defect. Generally, a wafer is formed on its surface with a plurality of shots, each of which is a wiring pattern on an exposure mask transferred onto the wafer. Thus, locations of wire defects were identified for all shots within the surface of each wafer.

Next, description will be made on the result of the comparison of wire defect counts found by the foregoing experiment method.

Figure 3A:
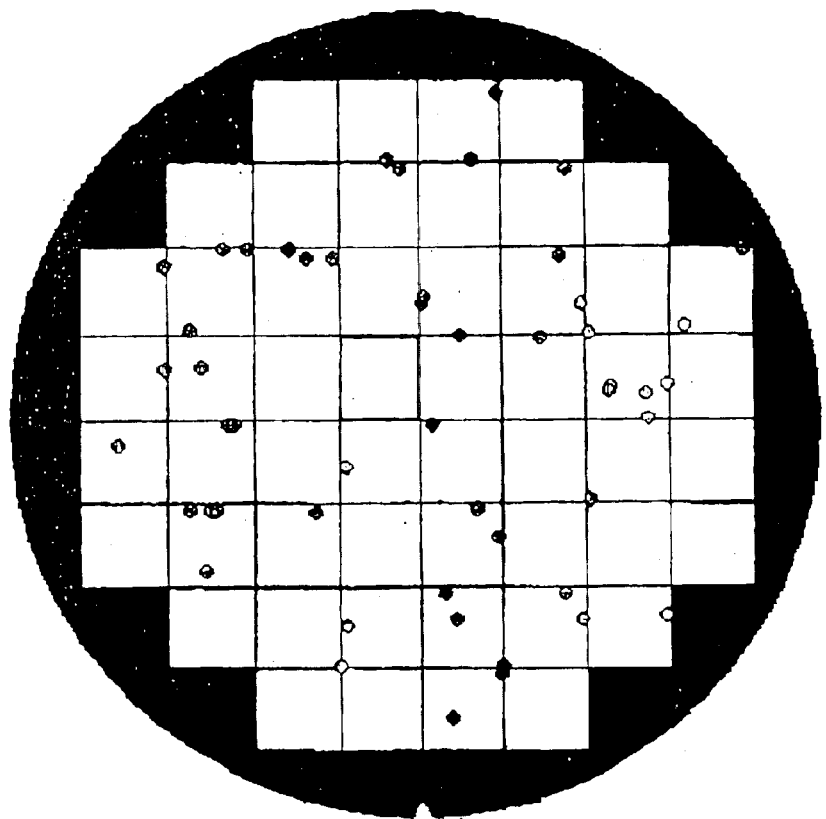
FIGS. 3A and 3B show defect distribution diagrams each showing locations of defects on the surface of a wafer.
Figure 3B:
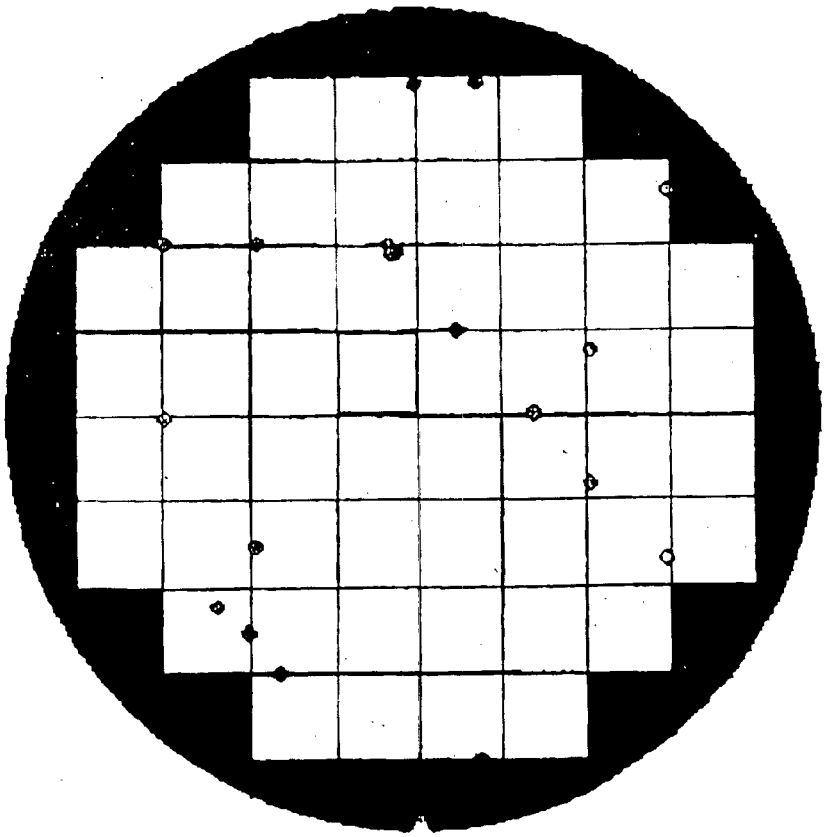

FIGS. 3A and 3B are defect distribution diagrams each showing the locations of defects on the surface of a wafer. FIG. 3A is a defect distribution diagram for the wafer which had not been treated with the organic acid solution before the copper grain growth annealing. FIG. 3B is a defect distributing diagram for the wafer which had been treated with the organic acid solution before the copper grain growth annealing.

As shown in FIG. 3A, wire defects were found at 57 locations over the entire surface of the wafer which had not been treated with the organic acid. For identifying the cause for the defects, component elements at the locations of the wire defects were analyzed after removing copper metal layer 22, and Ta and oxygen were detected. It was found from this analysis that a tantalum oxide compound was formed at those locations. On the other hand, as shown in FIG. 3B, wire defects were found at 19 locations on the surface of the wafer which had been treated with the organic acid. It was readily confirmed from the result of the analysis that the defects at these 19 locations were caused only by scratches in the CMP processing and losses of the pattern in micro-machining.

It is understood from the foregoing result that a wafer would suffer from wire defects over the entire surface thereof irrespective of the position on the wafer unless the wafer undergoes the organic acid solution treatment before the copper grain growth annealing.

While the aforementioned oxalic acid solution contained the oxalic acid in a concentration of 0.1–3%, the concentration of the oxalic acid is not limited in this range. In addition, the organic acid for removing the copper oxide is not limited to oxalic acid, but may be any compound which belongs to any of monocarboxylic acid, dicarboxylic acid, tricarboxylic acid, oxycarboxylic acid, and aminocarboxylic acid.

In the present invention, a wafer formed with a laminate metal film having a copper metal layer and a barrier metal is immersed in a solution including an organic acid having at least one carboxyl group, before the copper grain growth annealing, to remove from the laminate metal film such an oxide which can be the source of oxygen that diffuses during the annealing. It is therefore possible to eliminate the oxide produced by the reaction of the barrier metal with oxygen during the copper grain growth annealing.

Also, since the organic acid solution treatment removes from the copper metal layer those residual plating components other than oxygen, such as sulfur contained in an electrolyte plating solution, the resulting wafer is prevented from a degraded reliability due to the residual plating components such as sulfur, particularly, deteriorated stress-migration and electro-migration. Furthermore, the wafer is also prevented from the stress-induced-voiding.

While in the foregoing embodiment, the wafer is chemically and mechanically polished after the copper grain growth annealing, the CMP processing may be followed by the copper grain growth annealing, in which case the wafer may be treated with an organic acid solution, as mentioned above, before the copper grain growth annealing to remove a copper oxide formed on the surfaces of the copper metal layer and barrier metal, so that similar advantages can be provided.

In addition, copper wires may be formed in a plurality of layers. In this event, via plugs may be provided for electrically connecting the copper wires formed in the different layers. When each of the via plugs also have a barrier metal and a copper metal layer in a manner similar to the copper wires, the aforementioned advantages can be provided for the via plugs as well by the organic acid solution treatment before the copper grain growth annealing.

Also, while the foregoing embodiment has been described in connection with the copper wire formation based on a single damascene method, the present invention can be applied as well to a dual damascene method for forming copper wires and via plugs.

The copper grain growth annealing is not limited to the implementation in the batch furnace annealing apparatus, but may be implemented in a single wafer RTP (Rapid Thermal Process) apparatus which processes wafers one by one. In the copper grain growth annealing, hydrogen ($H_2$) may be included in the annealing atmosphere. This is because hydrogen atoms are trapped by unbonded hands on the copper grain boundaries to facilitate the flow of a current among copper grains.

The etching stopper film may be made of any of an SiON film, an SiN film, an $SiO_2$ film, and a SiC film, or a laminate film of these films, other than the SiCN film.

The interlayer insulating film, and the insulating film for forming a wire may be made of any of an organic film, an HSQ (hydrogensilsesquioxane)-based film, an MSQ (methylsilsesquioxane)-based film, and L-Ox (a registered trade name of NEC Electronics Corporation) film which is a film having a ladder-type hydrogenated siloxane structure, or a laminate film of these films, other than the $SiO_2$ film.

Further, the copper metal layer may contain a trace of other elements such as Si, Al and the like.

While a preferred embodiment of the present invention has been described using specific terms, such description is for illustrative purposes only, and it is to be understood that changes and variations may be made without departing from the spirit or scope of the following claims.

What is claimed is:

1. A method of manufacturing a semiconductor device which is formed with a laminate metal film having a copper metal layer mainly containing copper and a barrier layer containing a metal more susceptible to oxidization than copper, said method comprising the steps of:

forming a barrier layer on the bottom and sides of a recess formed in an insulating film on a semiconductor substrate;

forming said copper metal layer such that said copper metal layer covers said barrier layer and fills in said recess;

removing an oxide formed on the surface of said copper metal layer due to exposure of the surface of said copper metal layer to oxygen with a solution including an organic acid having at least one carboxyl group; and performing a heat treatment for growing grains of the copper.

2. The method of manufacturing a semiconductor device according to claim 1, wherein said organic acid is a compound which belongs to any of monocarboxylic acid, dicarboxylic acid, tricarboxylic acid, oxycarboxylic acid, and aminocarboxylic acid.

3. The method of manufacturing a semiconductor device according to claim 2, wherein said compound is oxalic acid.

4. The method of manufacturing a semiconductor device according to claim 1, wherein said heat treatment is performed in an inert atmosphere.

5. The method of manufacturing a semiconductor device according to claim 1, wherein said barrier layer is a metal layer including tantalum.

6. The method of manufacturing a semiconductor device according to claim 1, wherein said laminate metal film is used as a wire or a via plug for connecting wires to each other.

7. A method of manufacturing a semiconductor device which is formed with a laminate metal film having a copper metal layer mainly containing copper and a barrier layer containing a metal more susceptible to oxidization than copper, said method comprising the steps of:

forming a barrier layer on the bottom and sides of a recess formed in an insulating film on a semiconductor substrate;

forming said copper metal layer such that said copper metal layer covers said barrier layer and fills in said recess;

polishing said laminate metal film until the top surface of said insulating film is exposed;

removing an oxide formed on the surface of said copper metal layer due to exposure of the surface of said copper metal layer to oxygen with a solution including an organic acid having at least one carboxyl group; and performing a heat treatment for growing grains of the copper.

8. The method of manufacturing a semiconductor device according to claim 7, wherein said organic acid is a compound which belongs to any of monocarboxylic acid, dicarboxylic acid, tricarboxylic acid, oxycarboxylic acid, and aminocarboxylic acid.

9. The method of manufacturing a semiconductor device according to claim 8, wherein said compound is oxalic acid.

10. The method of manufacturing a semiconductor device according to claim 7, wherein said heat treatment is performed in an inert atmosphere.

11. The method of manufacturing a semiconductor device according to claim 7, wherein said barrier layer is a metal layer including tantalum.

12. The method of manufacturing a semiconductor device according to claim 7, wherein said laminate metal film is used as a wire or a via plug for connecting wires to each other.

* * * * *